United States Patent
Kuo et al.

(10) Patent No.: US 6,940,757 B2
(45) Date of Patent: Sep. 6, 2005

(54) STRUCTURE AND OPERATING METHOD FOR NONVOLATILE MEMORY CELL

(75) Inventors: Tung-Cheng Kuo, Hsin-Chu (TW); Hsiang-Lan Lung, Hsinchu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 104 days.

(21) Appl. No.: 10/610,881

(22) Filed: Jul. 2, 2003

(65) Prior Publication Data
US 2004/0037116 A1 Feb. 26, 2004

(30) Foreign Application Priority Data
Aug. 20, 2002 (TW) ........................................ 91118782 A

(51) Int. Cl.$^7$ ............................................. G11C 16/04
(52) U.S. Cl. ............................. 365/185.18; 365/185.28; 365/185.29
(58) Field of Search ..................... 365/185.18, 185.28, 365/185.29; 257/315

(56) References Cited

U.S. PATENT DOCUMENTS
6,418,060 B1 * 7/2002 Yang et al. ............ 365/185.28

* cited by examiner

Primary Examiner—David Lam
(74) Attorney, Agent, or Firm—Birch, Stewart, Kolasch & Birch, LLP

(57) ABSTRACT

A structure and operating method for a nonvolatile memory cell. First and second bit lines are disposed on a substrate. A channel is disposed between the first and second bit lines in an active area. First and second selective gates are disposed on the first and second bit lines respectively. An isolation structure is disposed between the first bit line and the first selective gate and between the second bit line and the second selective gate. A control gate is disposed over the first and second selective gates and the channel. An oxide-nitride-oxide (ONO) layer is disposed between the first and second selective gates and the control gate and between the channel and the control gate.

14 Claims, 4 Drawing Sheets

STRUCTURE AND OPERATING METHOD FOR NONVOLATILE MEMORY CELL

BACKGROUND OF THE INVENTION

1. Field of the Invention

The present invention relates in general to a structure and operating method for a nonvolatile memory cell. In particular, the present invention relates to a nonvolatile memory cell capable of operating at low voltage and its operating method.

2. Description of the Related Art

Memory devices for non-volatile storage of information are currently in widespread use today, in a myriad of applications. A nonvolatile memory is capable of changing its on/off state at the same gate voltage with presence/absence of charge carriers in the charge carrier storage structure. The charge carrier storage structure can be formed by a floating gate electrode or a silicon nitride film. A dielectric carrier trap structure having a silicon nitride film sandwiched between silicon oxide films is known as an oxide-nitride-oxide (ONO) film, and the nonvolatile memory having the dielectric carrier trap structure is called nitride read only memory (NROM).

A traditional NROM is shown in FIG. 1. In programming, electrons flowing from the substrate 12 are trapped in the memory position $M_a$ or/and $M_b$ in the silicon nitride layer 20 near the n-doped region 14 and 16. The silicon nitride layer 20 is sandwiched between the top oxide layer 22 and the bottom oxide layer 18. In writing data in the silicon nitride layer 20 near the n-doped region 16, that is, the right side, a ground voltage is applied to the n-doped region 14, a positive voltage, e.g., 6 V is applied to the n-doped region 16, and a high voltage, e.g., 8 V is applied to the control gate 24, as shown in Table 1. In this manner, the n-doped regions 14 and 16 function as source and drain respectively. These electrons are accelerated in the depletion layer and become hot electrons which pass through the bottom oxide film 18 and are injected into the silicon nitride film 20 at a memory position $M_b$. This writing mode is called channel hot electron (CHE) injection.

In erasing data, as shown in Table 1, a positive voltage, e.g., 7 V is applied to the n-doped region 16, and a negative voltage, e.g., −12 V is applied to the control gate 24. In this manner, the holes generated by band-to-band tunneling (BTB tunneling) pass through the bottom oxide layer 18 and are injected into the silicon nitride layer 20 to neutralize the stored charges at the memory position $M_b$ near the n-doped region 16. This erasing mode is called band-to-band tunneling.

TABLE 1

|  | programming (memory position $M_b$) | erase (memory position $M_b$) |
| --- | --- | --- |
| Voltage applied to the n-doped region 14 (source) | Ground | |
| Voltage applied to the n-doped region 16 (drain) | 6 V | 7 V |
| Voltage applied to the control gate 24 | 8 V | −12 V |

However, when executing programming and erase, a higher voltage is needed. Thus, high voltage elements are needed in circuit design and complexity of process is increased.

Furthermore, hot electrons and hot holes are generated in programming and erasure. Thus, the reliability of the bottom oxide layer is reduced.

Moreover, when electrons are stored at a position $M_{bb}$ different from a target memory position $M_b$, as shown in FIG. 2, the electrons at the changed memory position $M_{bb}$ cannot be erased by a usual erase operation. For the opposite situation, when holes are injected at a position $M_{bb}$ different from the predetermined memory position $M_b$, the electrons at the target memory position $M_b$ cannot be neutralized by the erase operation. No matter which situation occurs, overprogramming will be encountered in the next programming operation. Because the injection positions of electrons and holes are different, after long use, electrons and holes not only cannot be neutralized but will also encounter lateral diffusion.

SUMMARY OF THE INVENTION

In view of the above, it is an object of the present invention to provide a NROM structure having lower voltage and current in programming and erasure, thereby improving the reliability of the bottom oxide layer.

It is another objection of the present invention to provide a NROM structure which can be operated at lower voltage.

It is still another objection of the present invention to provide a NROM structure in which the injection positions of electrons and holes are the same when programming and erasing so as to prevent over programming problem.

According to one aspect of the present invention, a nonvolatile memory cell is provided. A first bit line and a second bit line are disposed in a substrate. A channel is disposed between the first and second bit lines on an active area. A first selective gate and a second selective gate are disposed on the first bit line and the second bit line respectively, wherein bottom corners of the first and second selective gates near the channel are acutely angled. An isolation structure is disposed between the first bit line and the first selective gate and between the second bit line and the second selective gate. A control gate is disposed over the first and second selective gates and the channel perpendicular to the first and second selective gates. An oxide-nitride-oxide (ONO) layer is disposed between the first and second selective gates and the control gate and between the channel and the control gate. The ONO layer has a first memory position and a second memory position near the bottom corners of the first selective gate and the second selective gate respectively.

According to one embodiment of the present invention, the angle of the bottom corners of the first and second selective gates near the channel is about 15~85°.

When programming the first memory position of the nonvolatile memory cell, a positive voltage is applied to the control gate, the first selective gate and the first bit line, a negative voltage is applied to the second selective gate, and 0V is applied to the second bit line.

When erasing the nonvolatile memory cell, a positive voltage is applied to the first and second selective gates, a negative voltage is applied to the substrate, and the control gate and the first and second bit lines are maintained in a floating state. Alternatively, a positive voltage is applied to the first and second bit lines, and a negative voltage is applied to the first and second selective gates and the control gate, thereby performing an erase operation.

When reading the first memory position of the nonvolatile memory cell, a reading voltage is applied to the second bit line, the first and second selective gate and the control gate, and 0V is applied to the first bit line.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE INVENTION

In accordance with the related figures, the structure and the operating method for the nitride read only memory (NROM) of the present invention will be explained in detail as follows.

Structure of NROM

Figure 3:
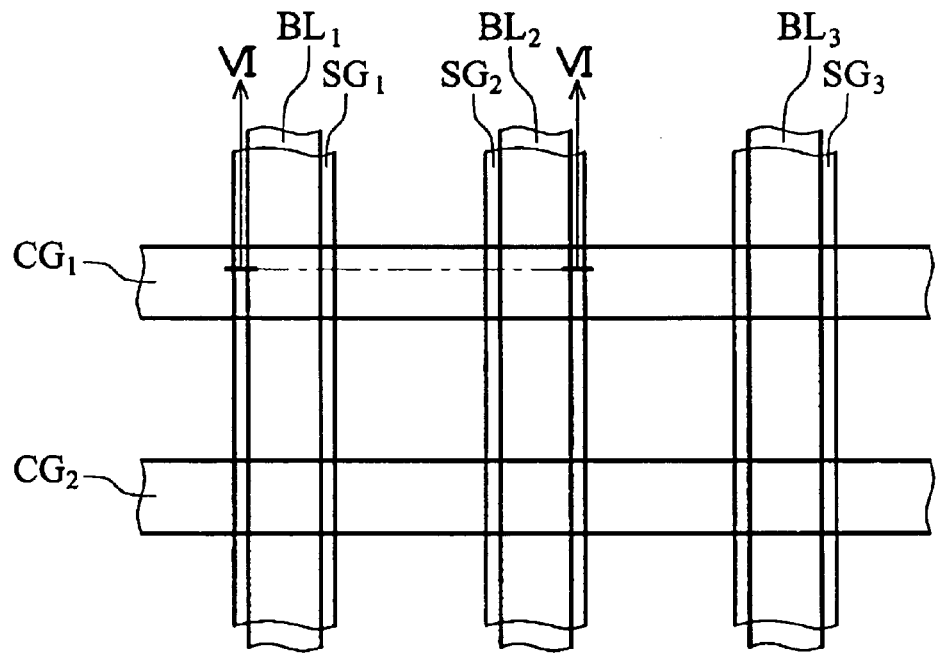
FIG. 3 is a layout of a NROM according to an embodiment of the present invention.
Figure 4:
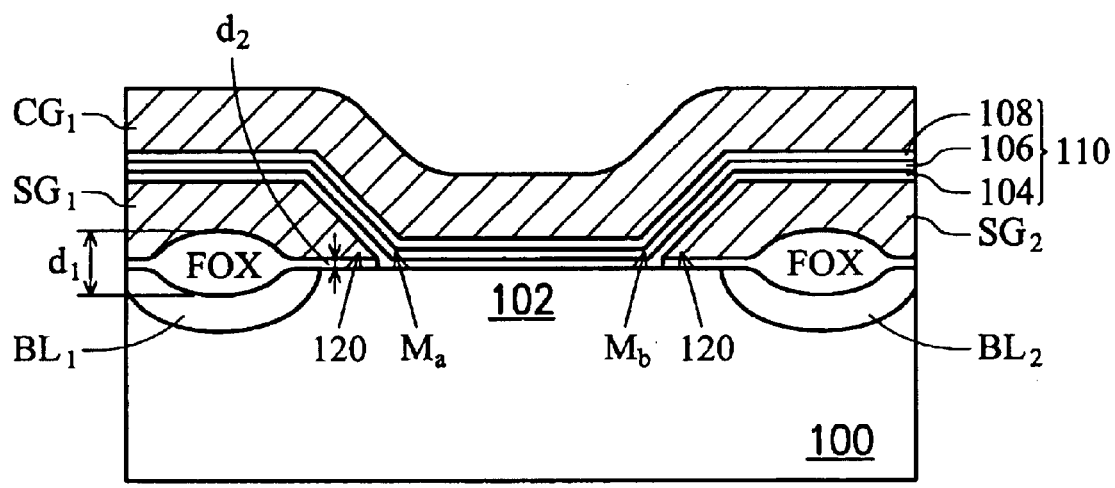
FIG. 4 is a cross section taken along VI—VI cut line of FIG. 3.

The present invention provides a NROM structure, as shown in FIG. 3 and FIG. 4, wherein FIG. 3 is a layout diagram, and FIG. 4 is a cross section taken from the VI—VI line located on FIG. 3. In FIG. 3, two parallel control gates $CG_1$ and $CG_2$, three parallel selective gates $BL_1$, $BL_2$ and $BL_3$, and three parallel selective gates $SG_1$, $SG_2$ and $SG_3$ are shown as an example. A detailed description of the preferred embodiment of the present invention is given in reference to the accompanying drawings.

A cross section of each NROM cell is shown in FIG. 4. A pair of bit lines $BL_1$ and $BL_2$, also called embedded bit lines, are disposed in a substrate 100. A channel 102 is disposed between the pair of bit lines $BL_1$ and $BL_2$ on an active area.

A pair of selective gates $SG_1$ and $SG_2$ are disposed on the pair of bit lines $BL_1$ and $BL_2$ respectively, and parallel the pair of bit lines $BL_1$ and $BL_2$. The channel 102 is disposed between the bit line $BL_1$ and the bit line $BL_2$ in the substrate 100, and comprises the area under a part of the pair of selective gates $SG_1$ and $SG_2$. The bottom corners 120 of the pair of selective gates $SG_1$ and $SG_2$ near the channel 102 are acutely angled, such as about 15~85°. Each selective gate $SG_1$ or $SG_2$ is wider than underlying bit line $BL_1$ or $BL_2$. In other words, the elements under each selective gate $SG_1$ or $SG_2$ comprise a field oxide layer FOX, a part of bit line $BL_1$ or $BL_2$ and a part of channel 102. The selective gates $SG_1$ and $SG_2$ are polysilicon.

An isolation structure, such as the field oxide layer FOX, is disposed between each bit line $BL_1$ or $BL_2$ and the corresponding selective gates $SG_1$ and $SG_2$. The field oxide layer FOX has a center thickness $d_1$ between 630 Å and 670 Å and a side thickness $d_2$ between 130 Å and 170 Å.

A control gate $CG_1$ is disposed over the selective gates $SG_1$ and $SG_2$ and the channel 102 perpendicular to the selective gates $SG_1$ and $SG_2$. The control gate $CG_1$ is polysilicon.

An oxide-nitride-oxide (ONO) layer 110 is disposed between the selective gates $SG_1$ and $SG_2$ and the control gate $CG_1$ and between the channel 102 and the control gate $CG_1$.

The ONO layer 110 is a stacked structure of bottom oxide layer-silicon nitride layer-top oxide layer, and the bottom oxide layer 104, the silicon nitride layer 106 and the top oxide layer 108 are about 57~63 Å, about 47~53 Å and about 60~70 Å thick, respectively.

The memory positions $M_a$ and $M_b$ are located in the silicon nitride layer 106 of the ONO layer 110 near the bottom corners 120 of the pair of selective gates $SG_1$ and $SG_2$.

Programming Operating Method for NROM: Point Discharge Mode

Figure 5:
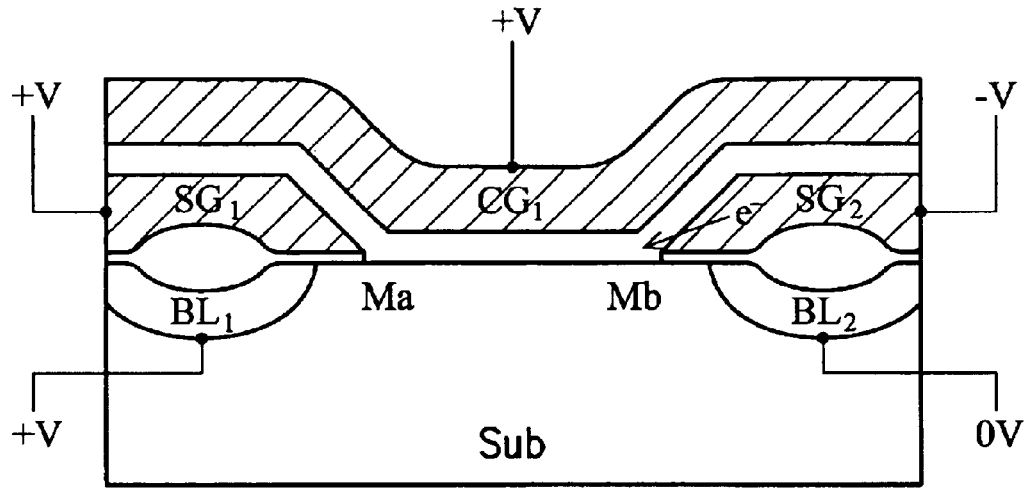
FIG. 5 is a cross section illustrating a programming operation for the NROM of the embodiment.

FIG. 5 shows a programming operation for NROM according to the preferred embodiment of the present invention.

Figure 1:
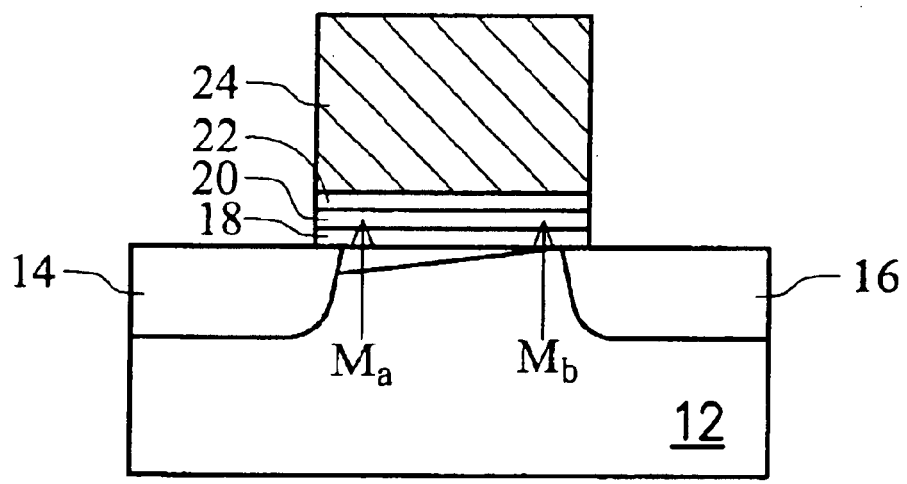
FIG. 1 shows a traditional NROM structure.
Figure 2:
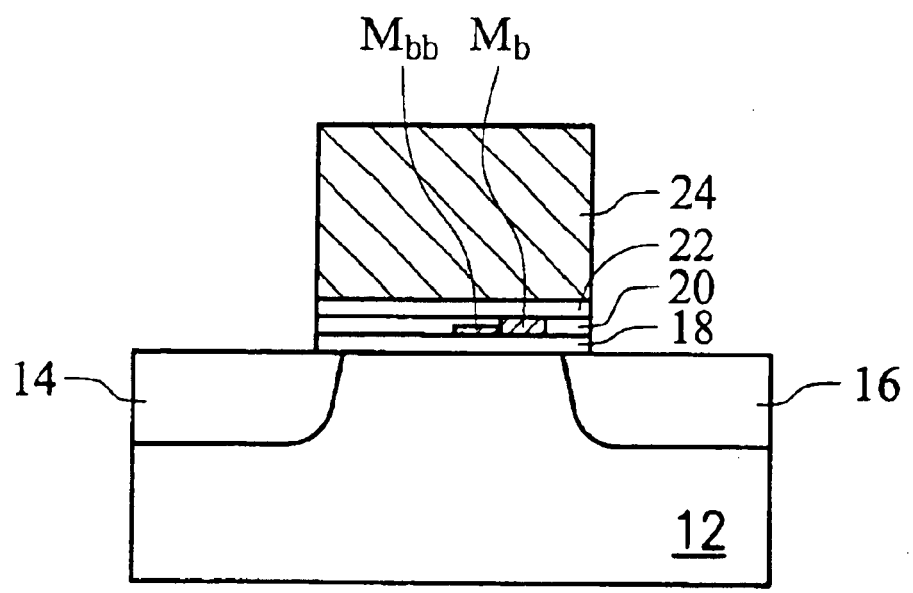
FIG. 2 is a cross section showing the target and changed memory positions in the silicon nitride layer.

When programming the memory position $M_b$ (that is right side, the same as shown in FIG. 1) as an example, a positive voltage (+V) is applied to the control gate $CG_1$, the selective gate $SG_1$ and the bit line $BL_1$, a negative voltage (−V) is applied to the selective gate $SG_2$ and 0V is applied to the bit line $BL_2$. Hence, a higher electric field is created at the bottom corner of the selective gate $SG_2$, resulting in electrons FN tunnelling. The electrons are injected into the silicon nitride layer in the direction shown and are trapped in the memory position $M_b$. In such case, the threshold voltage (Vt) of the transistor is increased.

Specifically, the positive voltage applied to the control gate $CG_1$, the selective gate $SG_1$ and the bit line $BL_1$ is about 3~7 V, and the negative voltage applied to the selective gate $SG_2$ is about −3~−8 V.

Similarly, when programming the memory position $M_a$ (that is left side, the same as shown in FIG. 1), the applied voltage of the selective gate $SG_1$ and that of the selective gate $SG_2$ are changed over, as are the applied voltages of the bit line $BL_1$ and bit line $BL_2$. Hence, a higher electric field is created at the bottom corner of the selective gate $SG_1$, resulting in electrons FN tunnelling. The electrons are injected into the silicon nitride layer in the direction shown and are trapped in the memory position $M_a$.

When programming is carried out by point discharge mode, the electrons are injected into the memory position $M_a$ and/or $M_b$ in the silicon nitride layer from the bottom corner of the selective gate $SG_1$ and/or $SG_2$. The injecting route of the electrons does not shift, thus, neither do the injecting positions of electrons.

Erase Operating Method for NROM: Point Discharge Mode

Figure 6:
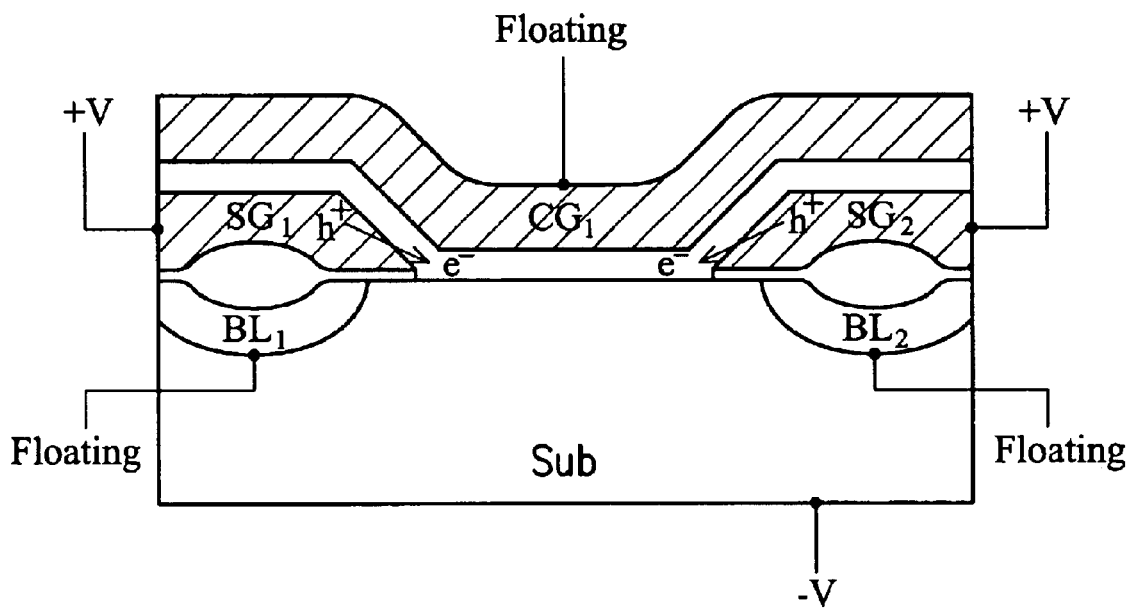
FIG. 6 is a cross section illustrating a first erase operation for the NROM of the embodiment.

FIG. 6 shows an erase operation for NROM according to the preferred embodiment of the present invention. A positive voltage (+V) is applied to the selective gates $SG_1$ and $SG_2$, a negative voltage (−V) is applied to the substrate Sub, and the control gate $CG_1$ and the bit lines $BL_1$ and $BL_2$ are maintained in a floating state. In such situation, a higher electric field is created at the bottom corner of the selective gates $SG_1$ and $SG_2$, resulting in point discharge. The holes are injected into the silicon nitride layer in the direction shown and are trapped in the memory position $M_a$ and $M_b$.

When erasure is carried out by point discharge mode, the holes are injected into the memory position $M_a$ and/or $M_b$ in the silicon nitride layer from the bottom corner of the selective gate $SG_1$ and/or $SG_2$. The injecting route of the holes does not shift, thus, neither do the injecting positions of electrons, that is, the memory positions Ma and Mb.

Specifically, the positive voltage applied to the selective gates $SG_1$ and $SG_2$ is about 4~6 V, and the negative voltage applied to the substrate Sub is about −6~−8 V.

The injecting routes of the holes generated in the erase operation and that of the electrons generated in the above-mentioned programming operation are the same, both being from the bottom corner of the selective gate $SG_1$ and/or $SG_2$ into the memory position $M_a$ and/or $M_b$ in the silicon nitride layer. Thus, the bottom oxide layer of the ONO layer has good reliability.

Erase Operating Method for NROM: BTB Tunneling Mode

Figure 7:
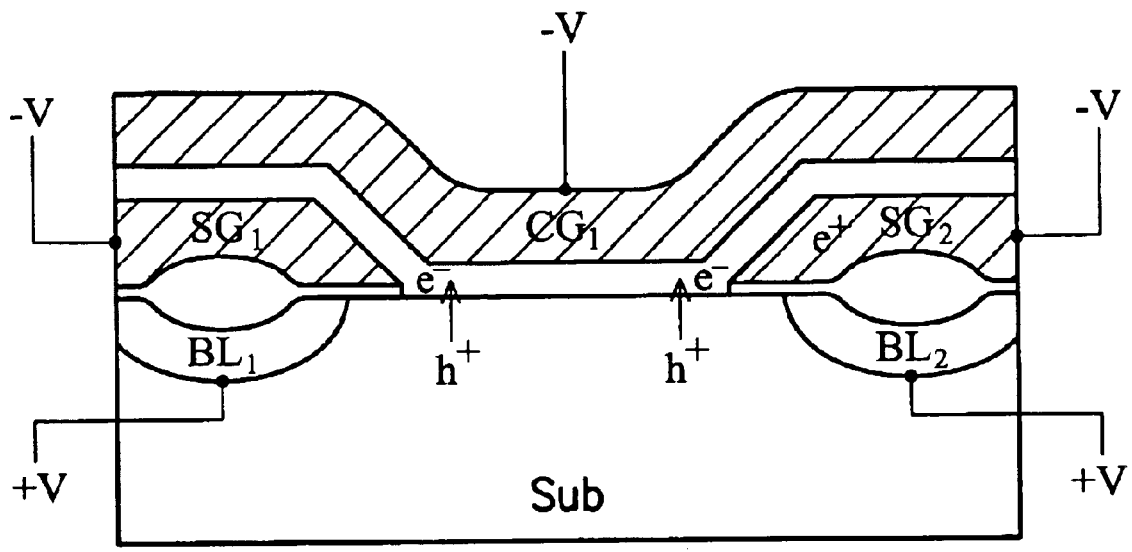
FIG. 7 is a cross section illustrating a second erase operation for the NROM of the embodiment.

FIG. 7 shows an erase operation for NROM according to the preferred embodiment of the present invention. A positive voltage (+V) is applied to the bit lines $BL_1$ and $BL_2$, and a negative voltage (−V) is applied to the selective gates $SG_1$ and $SG_2$ and the control gate $CG_1$. In such situation, holes produced by band-to-band tunneling (BTB tunneling) pass through the bottom oxide layer into the silicon nitride layer to neutralize the charges stored in the memory positions $M_a$ and $M_b$.

Specifically, the positive voltage applied to the bit line $BL_1$ and $BL_2$ is about 6~8 V, and the negative voltage applied to the selective gate $SG_1$ and $SG_2$ and the control gate $CG_1$ is about −11~−13 V.

The injecting routes (from the channel in the substrate into the silicon nitride layer) of the holes generated in the erase operation and of the electrons generated in the above-mentioned programming operation are different. Thus, the bottom oxide layer of the ONO layer has good reliability.

Read Operating Method for NROM

Figure 8:
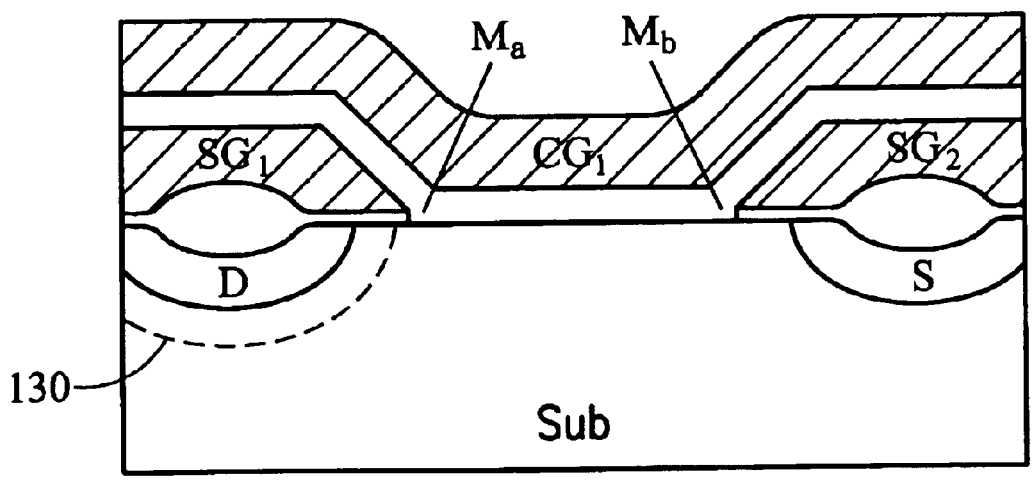
FIG. 8 is a cross section illustrating a read operation for the NROM of the embodiment.

FIG. 8 shows a read operation for NROM according to the preferred embodiment of the present invention.

When reading the memory position $M_b$ as an example, the n-doped region under the selective gate $SG_2$ functions as source S and the n-doped region under the selective gate $SG_1$ functions as drain D. A reading voltage, such as 2~3 V, is applied to the drain D, the selective gates $SG_1$ and $SG_2$ and the control gate $CG_1$, and 0 V is applied to the source S. In such situation, a depletion region 130 is created near the drain D and broadens into the region under the memory position $M_a$, thus, the read operation is not influenced irrespective of electrons being trapped in the memory position $M_a$.

When the electrons are trapped in the memory position $M_b$ to be read, the threshold voltage of the transistor is increased, for example, to about 3.5 V. On the contrary, when no electrons are trapped in the memory position $M_b$ to be read, the threshold voltage of the transistor is maintained, for example, about 1.0 V. Hence, the reading voltage is set between the two Vt, preferably 2~3 V.

As mentioned above, the NROM structure of the present invention has lower applied voltage and current when executing programming and erase operations. Hence, the reliability of the bottom oxide layer is improved. Furthermore, the NROM can be operated at lower voltage, and high voltage elements are not needed in the circuit design. The circuit design and process are simplified. Moreover, when executing programming and erase operations, the electrons and the holes are injected into the silicon nitride layer at the same position, thus, the electrons or the holes are neutralized without question and overprograming is prevented.

The programming operation for the NROM of the present invention is in point discharge mode and the electrons are injected from the bottom corner of the selective gate into the silicon nitride layer. The erase operation for the NROM of the present invention can be in point discharge mode, in which the holes are injected from the bottom corner of the selective gate into the silicon nitride layer, or in band-to-band tunneling (BTB tunneling) mode, in which the holes are injected from the channel into the silicon nitride layer.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A nonvolatile memory cell, comprising:
   a substrate;
   a first bit line and a second bit line disposed in the substrate;
   a channel disposed between the first and second bit lines on an active area;
   a first selective gate and a second selective gate disposed on the first bit line and the second bit line respectively, wherein bottom corners of the first and second selective gates near the channel are acutely angled;
   an isolation structure disposed between the first bit line and the first selective gate and between the second bit line and the second selective gate;
   a control gate disposed over the first and second selective gates and the channel perpendicular to the first and second selective gates; and
   an oxide-nitride-oxide (ONO) layer disposed between the first and second selective gates and the control gate and between the channel and the control gate.

2. The nonvolatile memory cell as claimed in claim 1, wherein the channel comprises the area under a part of the first and second selective gates.

3. The nonvolatile memory cell as claimed in claim 1, wherein the ONO layer is a stacked structure of bottom oxide layer-silicon nitride layer-top oxide layer, and the bottom oxide layer, the silicon nitride layer and the top oxide layer are about 57~63 Å, about 47~53 Å and about 60~70 Å thick, respectively.

4. The nonvolatile memory cell as claimed in claim 1, wherein the bottom corners of the first and second selective gates near the channel are about 15~85°.

5. The nonvolatile memory cell as claimed in claim 1, wherein the isolation structure is a field oxide layer, and the field oxide layer has a center thickness between 630 Å and 670 Å and a side thickness between 130 Å and 170 Å.

6. The nonvolatile memory cell as claimed in claim 1, wherein the first and second selective gates are polysilicon.

7. An operating method for a nonvolatile memory cell, wherein the nonvolatile memory cell comprises a substrate, a first bit line and a second bit line disposed in the substrate, a channel disposed between the first and second bit lines on an active area, and a first selective gate and a second selective gate disposed on the first bit line and the second bit line respectively, wherein bottom corners of the first and second selective gates near the channel are acutely angled, and an isolation structure is disposed between the first bit line and the first selective gate and between the second bit line and the second selective gate, a control gate disposed over the first and second selective gates and the channel perpendicular to the first and second selective gates, and an oxide-nitride-oxide (ONO) layer is disposed between the first and second selective gates and the control gate and between the channel and the control gate, wherein the ONO layer has a first memory position and a second memory position near the bottom corners of the first selective gate and the second selective gate respectively, the operating method comprising:

applying a positive voltage to the control gate, the first selective gate and the first bit line, applying a negative voltage to the second selective gate, and applying 0V to the second bit line, thereby performing a programming operation;

applying a positive voltage to the first and second selective gates, applying a negative voltage to the substrate, and maintaining the control gate and the first and second bit lines in a floating state, thereby performing an erase operation;

applying a reading voltage to the second bit line, the first and second selective gate and the control gate, and applying 0V to the first bit line, thereby performing a read operation on the first memory position.

8. The operating method for a nonvolatile memory cell as claimed in claim 7, wherein when performing the programming operation, the positive voltage of 3~7 V is applied to the control gate, the first selective gate and the first bit line, and the negative voltage of −3~−8 V is applied to the second selective gate.

9. The operating method for a nonvolatile memory cell as claimed in claim 7, wherein when performing the erase operation, the positive voltage of 4V–6V is applied to the first and second selective gates, and the negative voltage of −6~−8 V is applied to the substrate.

10. The operating method for a nonvolatile memory cell as claimed in claim 7, wherein when performing the read operation, the reading voltage is 2~3 V.

11. An operating method for a nonvolatile memory cell, wherein the nonvolatile memory cell comprises a substrate, a first bit line and a second bit line disposed in the substrate, a channel disposed between the first and second bit lines on an active area, a first selective gate and a second selective gate disposed on the first bit line and the second bit line respectively, wherein bottom corners of the first and second selective gates near the channel are acutely angled, and an isolation structure is disposed between the first bit line and the first selective gate and between the second bit line and the second selective gate, a control gate is disposed over the first and second selective gates and the channel is perpendicular to the first and second selective gates, and an oxide-nitride-oxide (ONO) layer is disposed between the first and second selective gates and the control gate and between the channel and the control gate, wherein the ONO layer has a first memory position and a second memory position near the bottom corners of the first selective gate and the second selective gate respectively, the operating method comprising:

applying a positive voltage to the control gate, the first selective gate and the first bit line, applying a negative voltage to the second selective gate, and applying 0V to the second bit line, thereby performing a programming operation;

applying a positive voltage to the first and second bit lines, and applying a negative voltage to the first and second selective gates and the control gate, thereby performing an erase operation;

applying a reading voltage to the second bit line, the first and second selective gate and the control gate, and applying 0V to the first bit line, thereby performing a read operation to the first memory position.

12. The operating method for a nonvolatile memory cell as claimed in claim 11, wherein when performing the programming operation, the positive voltage of 3~7 V is applied to the control gate, the first selective gate and the first bit line, and the negative voltage of −3~−8 V is applied to the second selective gate.

13. The operating method for a nonvolatile memory cell as claimed in claim 11, wherein when performing the erase operation, the positive voltage of 6V −8V is applied to the first and second bit lines, and the negative voltage of −11~−13 V is applied to the first and second selective gates and the control gate.

14. The operating method for a nonvolatile memory cell as claimed in claim 11, wherein when performing the read operation, the reading voltage is 2~3 V.

* * * * *